US012791607B2

(12) United States Patent
Kikuchi et al.

(10) Patent No.: US 12,791,607 B2
(45) Date of Patent: Nov. 10, 2026

(54) TEMPERATURE CONTROL APPARATUS, TEST APPARATUS, TEMPERATURE CONTROL METHOD, AND NON-TRANSITORY COMPUTER READABLE MEDIUM

(71) Applicant: ADVANTEST CORPORATION, Tokyo (JP)

(72) Inventors: Aritomo Kikuchi, Tokyo (JP); Karthik Ranganathan, Lake Forest, CA (US)

(73) Assignee: ADVANTEST CORPORATION, Tokyo (JP)

( * ) Notice: Subject to any disclaimer, the term of this patent is extended or adjusted under 35 U.S.C. 154(b) by 197 days.

(21) Appl. No.: 18/632,311

(22) Filed: Apr. 11, 2024

(65) Prior Publication Data

US 2024/0288491 A1 Aug. 29, 2024

Related U.S. Application Data

(63) Continuation of application No. PCT/JP2022/009709, filed on Mar. 7, 2022.

(51) Int. Cl.
*G01R 31/28* (2006.01)
*H10P 72/00* (2026.01)

(52) U.S. Cl.
CPC ...... *G01R 31/2875* (2013.01); *H10P 72/0602* (2026.01)

(58) Field of Classification Search
CPC ............... G01R 31/26; G01R 31/2874; G01R 31/2875; G01R 31/00; G01R 31/3842;
(Continued)

(56) References Cited

U.S. PATENT DOCUMENTS 6,058,012 A * 5/2000 Cooper .................. G06F 1/203 361/689
6,147,506 A 11/2000 Ahmad
(Continued)

FOREIGN PATENT DOCUMENTS

JP 2005302855 A 10/2005
JP 2017011169 A 1/2017
(Continued)

OTHER PUBLICATIONS

Product Specification for HCC Round Wafer Chucks. Instec, Inc. Accessed Oct. 4, 2024, at http://www.instec.com/portal/article/index/id/36/cid/12.html.
(Continued)

*Primary Examiner* — Vinh P Nguyen

(57) ABSTRACT

Provided is a temperature control apparatus, comprising: a mounting unit including a mounting surface for mounting a board-shaped test object on which a plurality of devices are formed; a plurality of heaters provided for each of a plurality of zones into which the mounting surface is divided, which heats corresponding one of the plurality of zones; a device temperature acquiring unit which acquires device temperature data according to a temperature measurement value in a device under test connected to a probe for an operation test among the plurality of devices of the test object; and a temperature control unit which controls two or more of the heaters corresponding to two or more of the zones on each of which at least part of the device under test is mounted, thereby closing a gap between a temperature indicated by the device temperature data and a first target temperature.

17 Claims, 12 Drawing Sheets

(58) Field of Classification Search
CPC .. G01R 31/3835; G01R 31/2863; G01R 1/04; G01R 31/374; G01R 31/2877; G01R 31/2886; G01R 31/2891; G01K 7/02; G01K 13/02; G01K 15/005; G01K 1/026; G01K 1/143; G01K 7/00; G01K 2217/00; G01K 1/20; G06F 1/206; G06F 1/20; G06F 2119/08; G06F 2200/201
See application file for complete search history.

(56) References Cited

U.S. PATENT DOCUMENTS

| | | | | |
|---|---|---|---|---|
| 6,445,203 | B1 * | 9/2002 | Yamashita | G01R 31/2874 324/750.08 |
| 7,225,864 | B2 | 6/2007 | Jeong | |
| 10,431,435 | B2 | 10/2019 | Lubomirsky | |
| 10,629,464 | B2 | 4/2020 | Oohashi | |
| 11,754,619 | B2 * | 9/2023 | Lou | G01R 31/2874 324/750.03 |
| 11,762,011 | B2 * | 9/2023 | Kasai | G01R 31/2875 324/750.08 |
| 11,796,400 | B2 * | 10/2023 | Kobayashi | G01K 17/06 |
| 2005/0274325 | A1 | 12/2005 | Kuibira | |
| 2009/0275149 | A1 | 11/2009 | Michaelson | |
| 2016/0378092 | A1 | 12/2016 | Yamamoto | |
| 2017/0229326 | A1 | 8/2017 | Tran | |
| 2017/0323813 | A1 | 11/2017 | Silveira | |
| 2017/0363680 | A1 | 12/2017 | Saito | |
| 2019/0088517 | A1 | 3/2019 | Kosakai | |
| 2019/0371634 | A1 | 12/2019 | Yamada | |
| 2020/0174066 | A1 | 6/2020 | Kobayashi | |
| 2020/0371156 | A1 | 11/2020 | Yamasaki | |
| 2021/0033666 | A1 | 2/2021 | Kasai | |
| 2021/0247248 | A1 | 8/2021 | Kobayashi | |
| 2021/0263542 | A1 | 8/2021 | Breitlow | |
| 2022/0015193 | A1 | 1/2022 | Kasai | |
| 2022/0043055 | A1 | 2/2022 | Akiyama | |
| 2022/0262661 | A1 | 8/2022 | Kasai | |

FOREIGN PATENT DOCUMENTS

| | | | |
|---|---|---|---|
| JP | 2017227478 | A | 12/2017 |
| JP | 2019102645 | A | 6/2019 |
| JP | 2019519098 | A | 7/2019 |
| JP | 2019212670 | A | 12/2019 |
| JP | 2020096152 | A | 6/2020 |
| JP | 2021019066 | A | 2/2021 |
| JP | 2021128006 | A | 9/2021 |
| JP | 2022015481 | A | 1/2022 |
| JP | 2022030909 | A | 2/2022 |
| TW | 202202964 | A | 1/2022 |
| WO | 01006273 | A9 | 7/2002 |
| WO | 2016080502 | A1 | 5/2016 |
| WO | 2020185744 | A1 | 9/2020 |

OTHER PUBLICATIONS

International Search Report and Written Opinion (ISA/237) of the International Search Authority for International Patent Application No. PCT/JP2022/009709, mailed by the Japan Patent Office on May 10, 2022.

Office Action issued for related Taiwanese Application 112101974, transmitted from the Taiwan Intellectual Property Office on Jul. 14, 2023 (issued on Jul. 11, 2023).

Office Action issued for related Taiwanese Application 112101974, transmitted from the Taiwan Intellectual Property Office on Dec. 21, 2023 (issued on Dec. 18, 2023).

* cited by examiner

TEMPERATURE CONTROL APPARATUS, TEST APPARATUS, TEMPERATURE CONTROL METHOD, AND NON-TRANSITORY COMPUTER READABLE MEDIUM

The contents of the following patent application(s) are incorporated herein by reference:

NO. PCT/JP2022/009709 filed in WO on Mar. 7, 2022

BACKGROUND

1. Technical Field

The present invention relates to a temperature control apparatus, a test apparatus, a temperature control method, and a non-transitory computer readable medium.

2. Related Art

Patent document 1 describes, "FIG. 1 is a diagram of a two zone temperature control system 102 for an electrostatic chuck 104 that supports a workpiece 106 in a plasma 124 processing chamber." (paragraph 0014), "The present diagram shows a two zone system or two loop system with two independent coolant flow zones." (paragraph 0018), and the like.

Patent document 2 describes, "The processing apparatus 100 performs predetermined processing, such as plasma etching, plasma CVD (Chemical Vapor Deposition), or heat treatment, on the semiconductor wafer W, which is an example object to be processed." (paragraph 0024), "The upper surface of the electrostatic chuck 6 on which the semiconductor wafer W is mounted is, for example, concentrically split into a plurality of split areas." (paragraph 0042), "For example, as shown in FIG. 4, the heater 6*c* is provided for each split area 60, inside the electrostatic chuck 6 and below each split area 60." (paragraph 0043), "For example, as shown in FIG. 4, at least one temperature sensor 20 is provided for each split area 60 on the lower surface of the electrostatic chuck 6." (paragraph 0044), and the like.

Patent document 3 describes, "The temperature distribution of each zone of split zones can individually be controlled by the plurality of main heaters, and the temperature in each zone can be adjusted finely by a sub heater which generates heat, the amount of which per unit area is smaller than the main heater. Thus, when a board-shaped sample is held, even if a temperature distribution partially occurs in the board-shaped sample due to changes in the generation state of plasma or the film formation condition, the temperature distribution can be suppressed by the fine adjustment of the temperature by the sub heater." (paragraph 0045).

Patent document 4 describes, "The temperature control apparatus 20 controls the temperature of the electronic device D formed in the wafer W on the stage 10 such that the temperature is fixed at a target temperature through heating by the heating mechanism 40 and cooling by the cooling mechanism 50." (paragraph 0029), "In the heating mechanism 40, the LED light incident on the lid member 31 on which the wafer W of the stage 10 is mounted is controlled in 43 units of LED unit. Accordingly, the heating mechanism 40 can aim the LED light only at any portion in the lid member 31, or can cause the intensity of the irradiation light for any portion to be different from that for another portion." (paragraph 0033), and "However, during the inspection, the relay 82 is often connected to the wire 81 side on the tester 4 side, and thus the temperature measuring circuit 80, for example, uses the temperature of the electronic device D only during system identification of the temperature estimating unit 60 and uses the temperature estimated by the temperature estimating unit 60 for temperature control of the electronic device D." (paragraph 0036).

PRIOR ART DOCUMENT

Patent Document

[Patent document 1] Japanese translation publication of a PCT rout patent application No. 2019-519098

[Patent document 2] Japanese patent application publication No. 2017-11169

[Patent document 3] International Publication No. 2016/080502

[Patent document 4] Japanese patent application publication No. 2021-19066

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments necessarily have to be essential to solving means of the invention.

Figure 1:
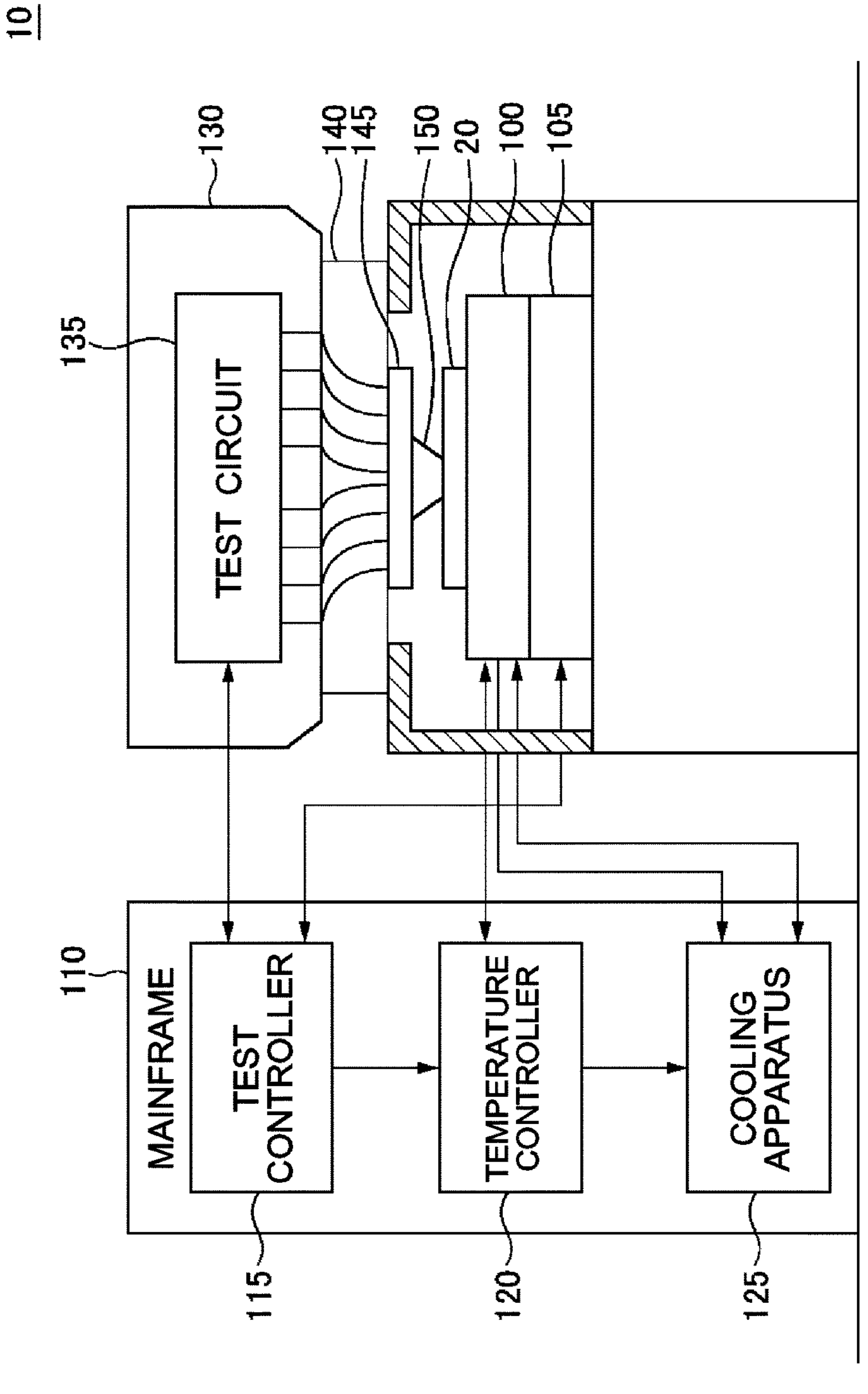
FIG. 1 shows a configuration of a test apparatus 10 according to the present embodiment.

FIG. 1 shows a configuration of a test apparatus 10 according to the present embodiment together with a wafer 20. The wafer 20 is an example of a test object in a board shape. The wafer 20 may be in a disk shape. A test object to be under test of the test apparatus 10 may be, instead of the wafer 20, a portion split from the wafer 20, or may be a substrate which devices are formed on, or the like. In the present embodiment, a plurality of devices, such as electronic devices or optical devices, are formed on a surface of the wafer 20, wherein the surface is on the upper side in the drawing (the surface is also described as "upper surface").

The test apparatus 10 is configured to perform an operation test of each device on the wafer 20 before each device on the wafer 20 are singulated through dicing. Such an operation test may be, for example, a function test of devices, BIST test using BIST circuit of devices, or the like. The test apparatus 10 includes a wafer chuck 100, a stage 105, a mainframe 110, a test head 130, a HiFix 140, and a probe card 145.

The wafer chuck 100 is an example of a mounting apparatus on which the test object is mounted, and by this mounting, the wafer chuck 100 supports the wafer 20 on which a plurality of devices are formed. The wafer chuck 100 according to the present embodiment is a vacuum chuck. Alternatively, the wafer chuck 100 may be an electrostatic chuck. The wafer chuck 100 may have a heater for each zone into which the mounting surface of the wafer 20 is divided so that temperature control can be performed on each zone. In addition, the wafer chuck 100 causes a refrigerant supplied from a cooling apparatus 125 to circulate to cool each zone.

The stage 105 is configured to movably support the wafer chuck 100. The stage 105 may be able to move the wafer chuck 100 in XYZ directions. The stage 105 may be able to cause the wafer chuck 100 to rotate around a vertical axis perpendicular to the upper surface of the wafer chuck 100.

The mainframe 110 is configured to control each unit in the test apparatus 10 so that the operation test of each device is performed under a predetermined temperature condition. In the present embodiment, the mainframe 110 is a casing different from the casing where the test head 130 and the like are provided. Alternatively, each configuration in the mainframe 110 may be provided in the same casing of the test head 130 and the like. The mainframe 110 includes a test controller 115, a temperature controller 120, and the cooling apparatus 125.

The test controller 115 may be a computer, such as a computer for control, a workstation, a server computer, a general-purpose computer, or a personal computer (PC). The test controller 115 may also be a computer system connected to a plurality of computers. Such a computer system is also a computer in a broad sense. In addition, the test controller 115 may be implemented by one or more virtual computer environments which can be executed in a computer. Alternatively, the test controller 115 may be a special purpose computer designed for an operation test of devices, or may be a special purpose hardware implemented by dedicated circuitry.

The test controller 115 is configured to control the operation test of each device in the wafer 20. The test controller 115, when implemented by a computer, may control the operation test of each device by performing a test control program. The test controller 115 instructs the stage 105 to cause each of the plurality of devices of the wafer 20 to contact with the probe card 145 in turn. The test controller 115 indicates the temperature condition of the operation test for the temperature controller 120 and causes the temperature controller 120 to control the temperature of the device under test. The test controller 115 supplies a test program to a test circuit 135 in the test head 130 to cause the test circuit 135 to execute the test program. The test controller 115 collects and stores test results of each device.

The temperature controller 120 is connected to the test controller 115. The temperature controller 120, as well as the test controller 115, may be implemented by a computer, or may be implemented by using a computer same as the test controller 115. Alternatively, the temperature controller 120 may be a special purpose hardware implemented by dedicated circuitry.

The temperature controller 120 is configured to control the temperature of the device under test in response to the instruction from the test controller 115. The temperature controller 120, when implemented by a computer, may control the temperature of the device under test by performing the temperature control program. The temperature controller 120 adjusts the temperature of the device under test such that the temperature satisfies a designated temperature condition by controlling a plurality of heaters that the wafer chuck 100 has and the cooling apparatus 125.

The cooling apparatus 125 is connected to the temperature controller 120. The cooling apparatus 125 is configured to supply a liquid or gas refrigerant to the wafer chuck 100, and cools the refrigerant having returned from the wafer chuck 100 down to a temperature designated by the temperature controller 120, and cause the refrigerant to circulate to the wafer chuck 100.

The test head 130 includes the test circuit 135. The test circuit 135 is connected to the test controller 115. The test circuit 135 may be provided on a test board which can be attachable to and detachable from the backplane of the body of the test head 130, or may be implemented by using a plurality of test boards. The test circuit 135 may include various circuits for determining the quality of the device under test by sending and receiving a signal to and from the device under test, which includes at least one of: a site controller configured to control each unit in the test circuit 135 by executing the test program;

a pattern generator configured to generate a test pattern; a timing generator configured to generate a timing; a waveform shaper configured to shape the test pattern by using the timing generated by the timing generator and output a test signal;

a driver circuit configured to amplify the test signal to output the amplified test signal to the device under test; a comparator configured to compare a response signal from the device under test with a target value; or a determiner configured to determine the quality of the device under test by using the comparison result from the comparator.

The HiFix 140 is connected between the test head 130 and the probe card 145. The HiFix 140 has a role of interfacing terminals between the test circuit 135 and the probe card 145, and connects each terminal of test circuit 135 and the corresponding terminal of the probe card 145 by a signal cable.

The probe card 145 is connected to the test circuit 135 via the HiFix 140. The probe card 145 includes a plurality of probes 150. Each of the plurality of probes 150 has one end electrically connected to the terminal of the test circuit 135 via the probe card 145 and the HiFix 140, and has the other end contacting with a terminal of an electrode pad that the device under test has, or the like. Thus, each probe 150 electrically connects the terminal of the test circuit 135 and the terminal of the device under test.

Note that the test apparatus 10 described above is to show an example of a configuration of the test apparatus, and there exist various variations of the function, structure, and arrangement of each unit. In addition, the test apparatus 10 may not include some configurations, or may include additional configurations in accordance with the content of the operation test to be performed.

Figure 2A:
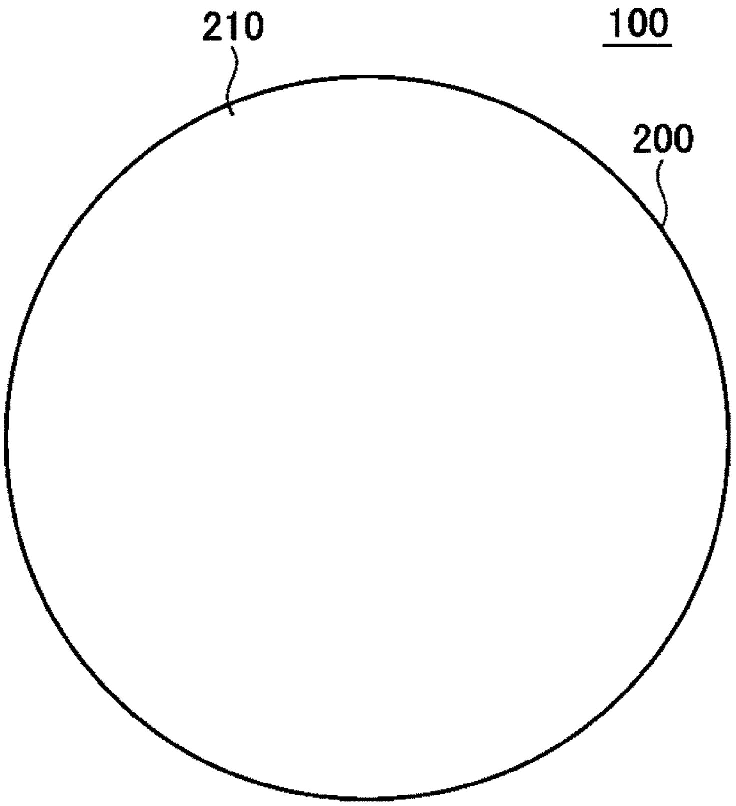
FIG. 2A is a top view of the wafer chuck 100 according to the present embodiment.
Figure 2B:
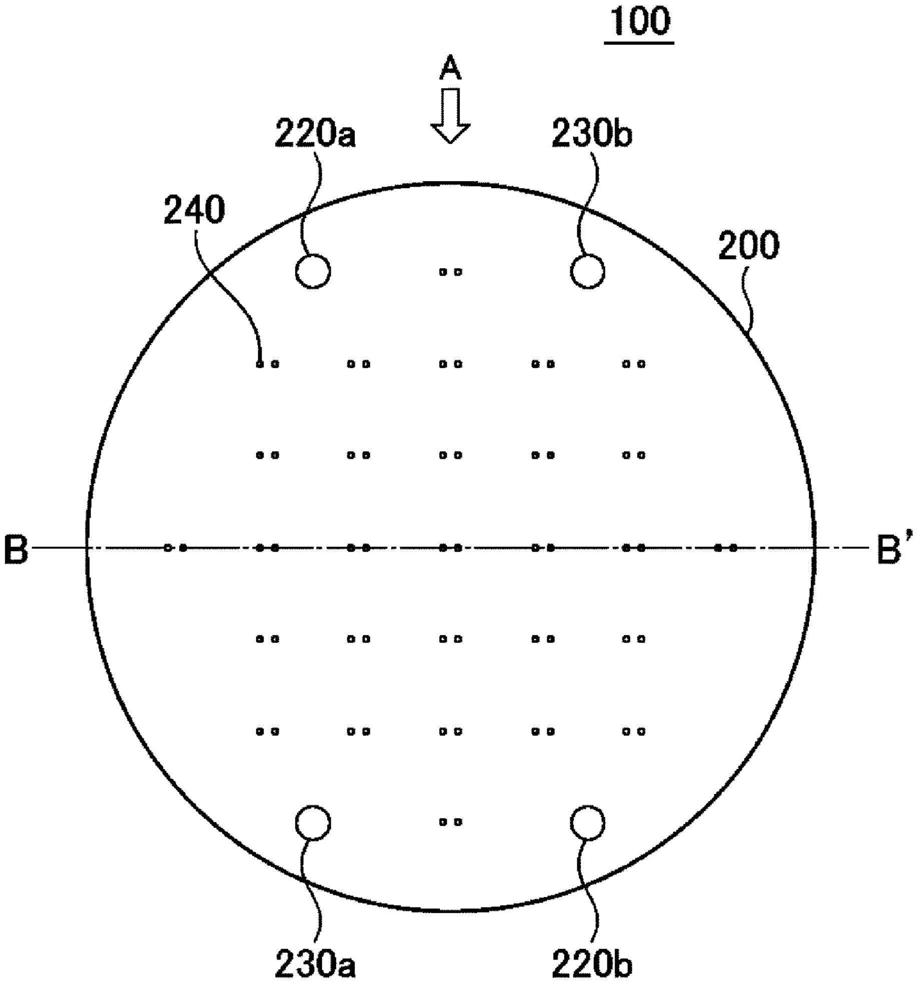
FIG. 2B is a bottom view of the wafer chuck 100 according to the present embodiment.

FIGS. 2A to 2E are a top view (FIG. 2A), a bottom view (FIG. 2B), a side view when seen from direction A in FIG. 2B (FIG. 2C), a cross-sectional perspective view at B-B' in FIG. 2B, and a cross-sectional side view at B-B' in FIG. 2B (FIG. 2D), of the wafer chuck 100 according to the present embodiment. As shown in FIG. 2A, the wafer chuck 100 has a mounting unit 200 in a disk shape. The surface on the first surface side of the mounting unit 200 is a mounting surface 210 on which the wafer 20 is mounted.

As shown in FIG. 2B, on the back side with respect to the mounting surface 210 of the mounting unit 200 (which is also described as "back surface"), at least one inlet 220*a-b* (which is also described as "inlet 220") and at least one outlet 230*a-b* (which is also described as "outlet 230") are provided. The inlet 220 is an aperture for causing the refrigerant supplied from the cooling apparatus 125 to flow into a space inside the mounting unit 200. The outlet 230 is an aperture for causing the refrigerant to flow out from the space inside the mounting unit 200. In the example of the present drawing, the space inside the mounting unit 200 is split into two spaces: a space in a semicircle portion on the left side and a space in a semicircle portion on the right side of the mounting unit 200, in FIG. 2B. The refrigerant flowing into the mounting unit 200 from the inlet 220*a* flows in the space in the semicircle portion on the left side of the mounting unit 200 to cool the mounting surface 210 and flows out from the outlet 230*a* to return to the cooling apparatus 125. The refrigerant flowing in the mounting unit 200 from the inlet 220*b* flows in the space in the semicircle portion on the right side of the mounting unit 200 to cool the mounting surface 210 and flows out from the outlet 230*b* to return to the cooling apparatus 125. Although, in the example of the present drawing, two inlets 220 and two outlets 230 are provided, any number of inlets 220 and any number of outlets 230 may be provided.

Figure 2C:
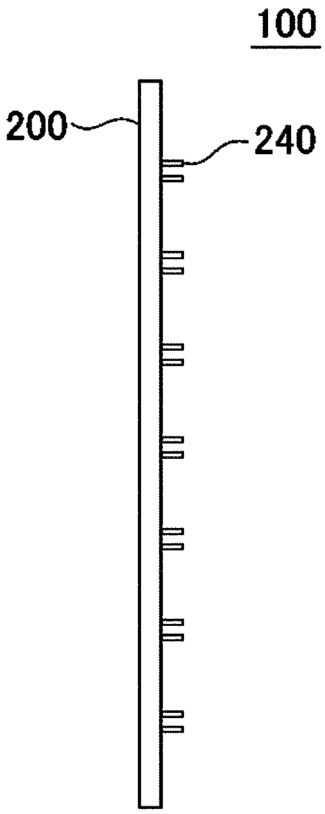
FIG. 2C is a side view of the wafer chuck 100 according to the present embodiment.

As shown in FIG. 2B and FIG. 2C, on the back surface of the mounting unit 200, a plurality of pin-shaped heater terminals 240 each connected to each of the plurality of heaters are exposed. In the example of the present drawing, two heater terminals 240 are provided for each heater, and these two heater terminals 240 are connected to both ends of the heater.

Figure 2D:
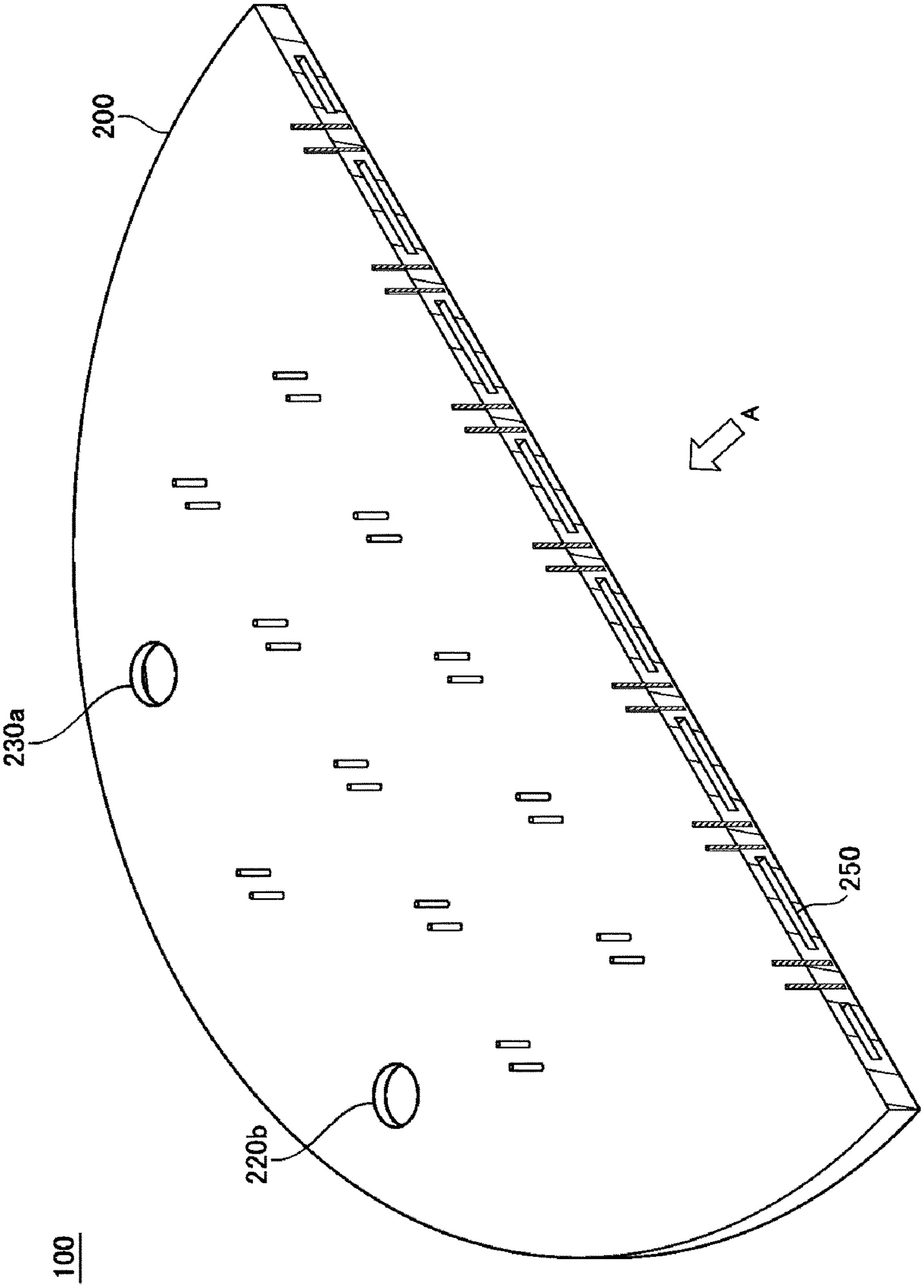
FIG. 2D is a cross-sectional perspective view of the wafer chuck 100 according to the present embodiment.
Figure 2E:
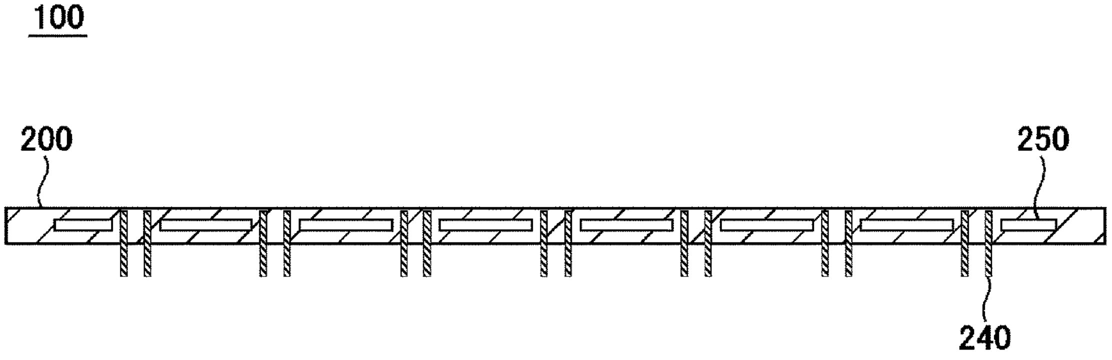
FIG. 2E is a cross-sectional side view of the wafer chuck 100 according to the present embodiment.

As shown in FIG. 2D and FIG. 2E, a flow channel 250 as a space in which the refrigerant from the inlet 220*a-b* flows is formed inside the mounting unit 200. In a portion where the heater terminal 240 in the mounting unit 200 is provided, the flow channel 250 is not provided, but a pillar through which the heater terminal 240 is threaded is provided. Thus, the heater terminal 240 does not contact with the refrigerant.

Figure 3A:
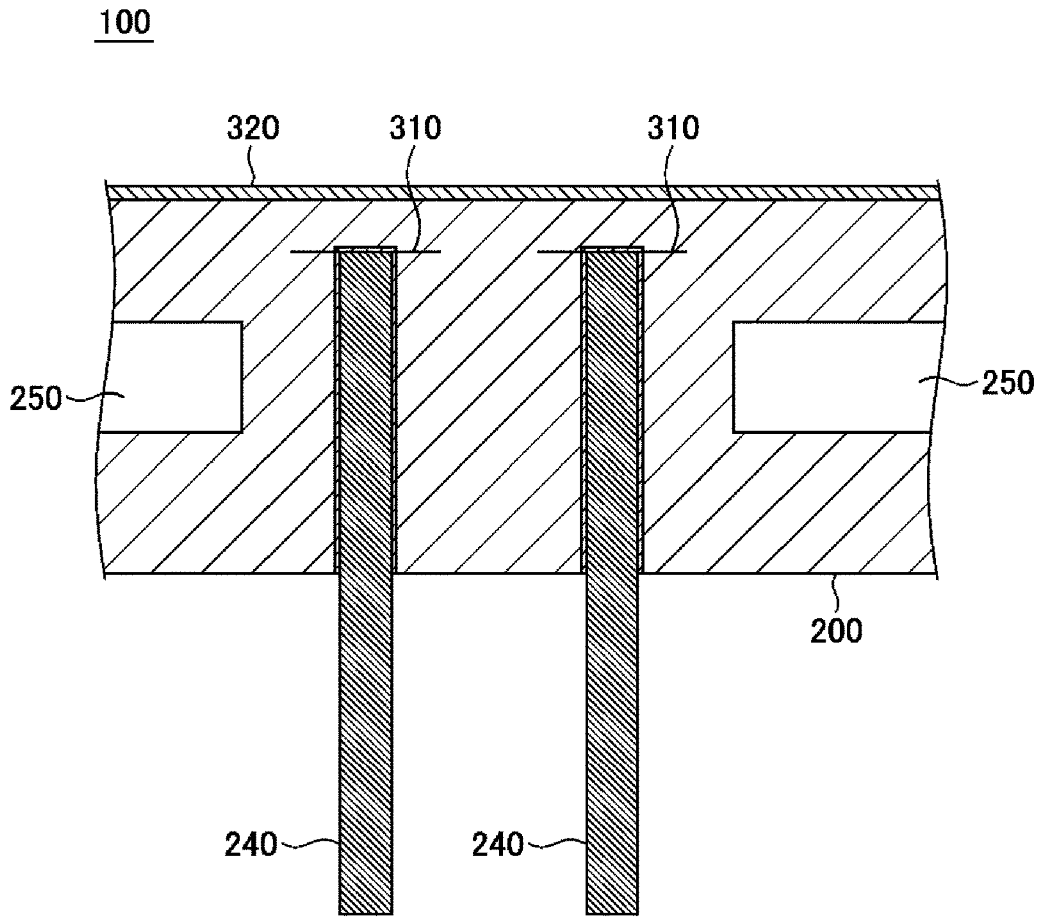
FIG. 3A is a cross-sectional enlarged view of the wafer chuck 100 according to the present embodiment.

FIG. 3A is a cross-sectional enlarged view of the wafer chuck 100 according to the present embodiment. The mounting unit 200 may be formed of ceramics such as aluminum nitride and has insulating properties. A heater 310 is formed near the mounting surface 210 in the mounting unit 200. The heater 310 may be provided in a layer closer to the mounting surface 210 than the back surface in the mounting unit 200. The heater terminal 240 extends from the heater 310 to the back surface side of the mounting unit 200 and is exposed from the back surface.

On the mounting surface 210 side of the mounting unit 200, a ground plane 320 that is conductive is formed. The ground plane 320 may cover at least the entire range of the mounting surface 210 on which the devices of the wafer 20 are mounted. The ground plane 320 may be connected to the ground and maintained to have a ground potential for at least a period during which the wafer 20 is mounted thereon. The ground plane 320 cuts off noise resulting from the operation of the heater 310 to prevent the noise from traveling to the device under test 400.

Figure 3B:
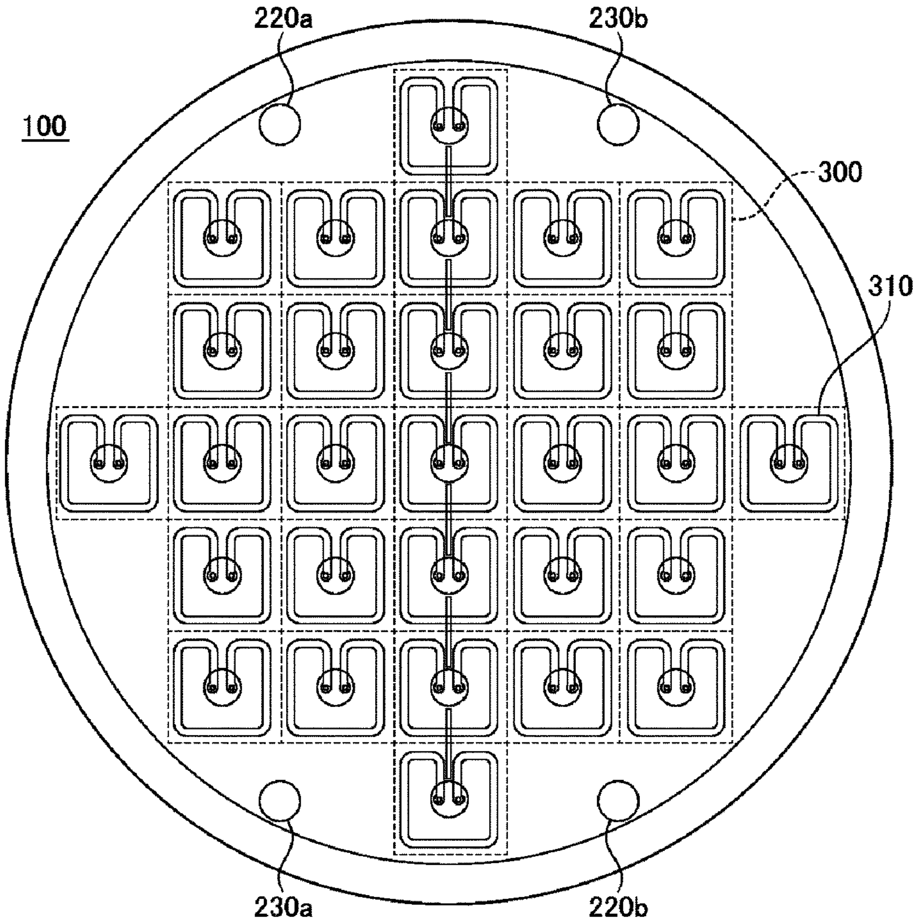
FIG. 3B is a transparent view of the wafer chuck 100 according to the present embodiment.

FIG. 3B is a transparent view of the wafer chuck 100 when seen from the mounting surface 210 side. The mounting surface 210 of the mounting unit 200 is divided into a plurality of zones 300. In the present embodiment, the plurality of zones 300 are arranged in a grid shape on the mounting surface 210. In the example of the present drawing, each zone 300 is in a rectangular shape and arranged to form a square grid or rectangular grid shape. Alternatively, the plurality of zones 300 may be arranged in a rhombic grid shape. The plurality of zones 300 may be arranged in a different grid shape, such as a hexagonal grid shape, and in accordance with this, the shape of each zone 300 may have a different shape, such as a hexagon.

The plurality of heaters 310 are provided for each zone 300, and each of the plurality of heaters 310 is configured to heat the corresponding zone 300. The present drawing shows an example of the wiring pattern of the heater 310 in the zone 300, and the wiring pattern of the heater 310 may use any wiring pattern that is able to heat the zone 300.

Figure 4:
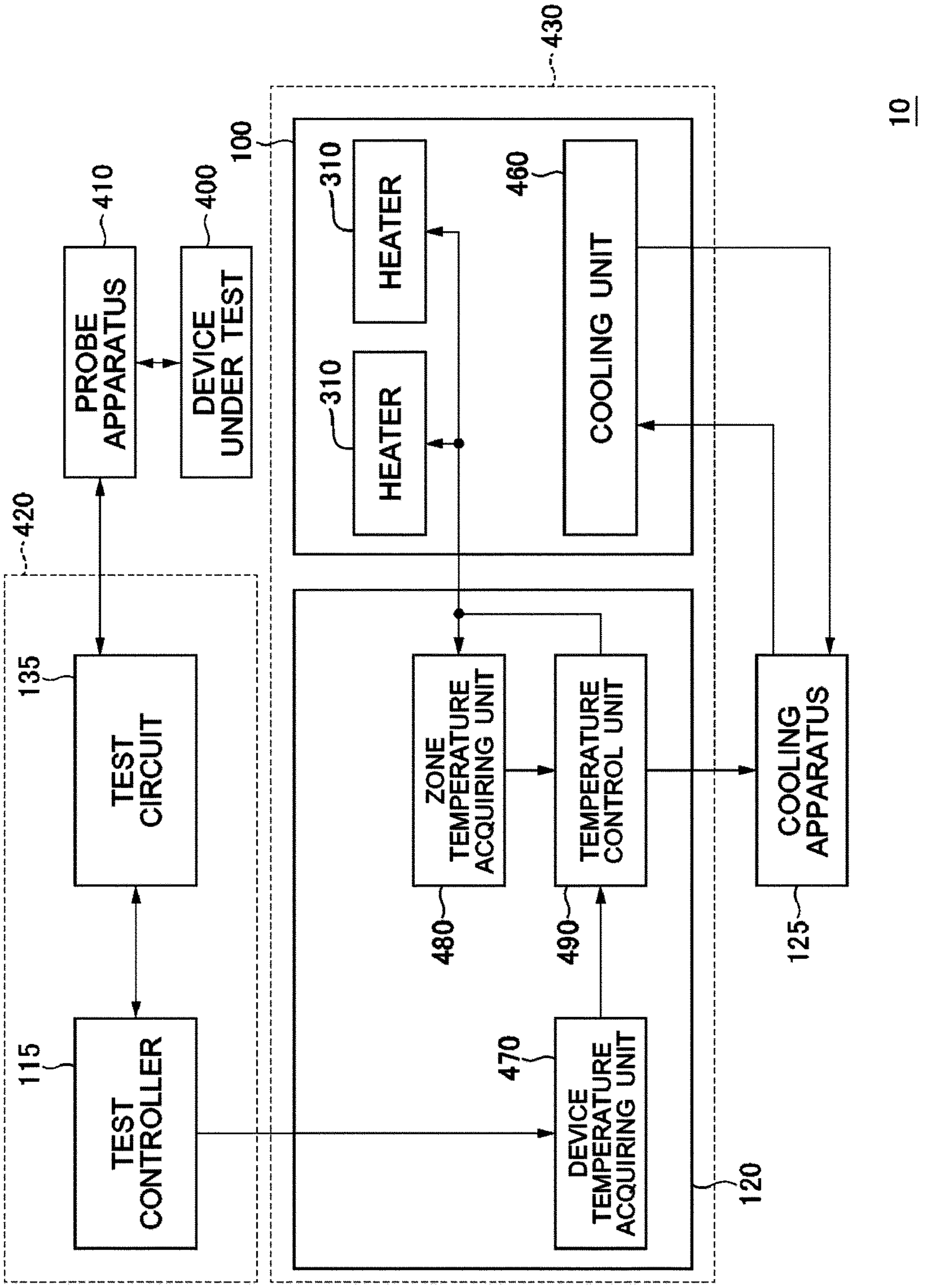
FIG. 4 shows functional configurations of the test apparatus 10 according to the present embodiment.

FIG. 4 shows functional configurations of the test apparatus 10 according to the present embodiment. The test apparatus 10 shown in FIG. 1 includes a probe apparatus 410, a test unit 420, a temperature control apparatus 430, and the cooling apparatus 125, as functional configurations. The probe apparatus 410 is a functional configuration including the HiFix 140 and the probe card 145 in FIG. 1. The probe apparatus 410 is configured to connect one or more probes 150 to each of one or more terminals of the device under test 400 to be the target of the operation test in the wafer 20 on which a plurality of devices are formed.

The test unit 420 is a functional configuration including the test controller 115 and the test circuit 135 in FIG. 1. The test unit 420 uses one or more probes 150 connected to the device under test 400 to perform the operation test of the device under test 400.

The temperature control apparatus 430 is a functional configuration including the wafer chuck 100 and the temperature controller 120 in FIG. 1. The wafer chuck 100 has the mounting unit 200 including the mounting surface 210 on which the wafer 20 including the device under test 400 is mounted, the plurality of heaters 310, and the cooling unit 460. In the present embodiment, the cooling unit 460 includes the flow channel 250, and is configured to cool the wafer 20 mounted on the mounting surface 210 by using the refrigerant.

The temperature controller 120 includes a device temperature acquiring unit 470, a zone temperature acquiring unit 480, and a temperature control unit 490. The device temperature acquiring unit 470 is configured to acquire device temperature data according to a temperature measurement value in the device under test 400 connected to the probe 150 for the operation test among the plurality of devices of the wafer 20. In the present embodiment, the test circuit 135 is configured to acquire a temperature measurement value of the temperature sensor in the device under test 400 by using at least one probe 150. The test controller 115 reads the temperature measurement value acquired by the test circuit 135 from the test circuit 135 and transmits the temperature measurement value to the device temperature acquiring unit 470. Thus, the device temperature acquiring unit 470 can acquire the device temperature data according to the temperature measurement value of the device under test 400. Alternatively, the device temperature acquiring unit 470 may be connected to the probe apparatus 410 to read the temperature measurement value of the temperature sensor in the device under test 400 by using the probe 150, or may be connected to the test circuit 135 to acquire the temperature measurement value from the test circuit 135.

The device temperature data acquired by the device temperature acquiring unit 470 may be the temperature measurement value itself of the temperature sensor in the device under test 400, or may be data that is converted from the temperature measurement value and changes in accordance with the temperature measurement value. For example, the device under test 400 may include a temperature sensor using a thermal diode, a resistance temperature detector, a thermocouple, or the like, and the temperature measurement value may be a value indicating a voltage, a current, a resistance value, or the like, depending on the kind of the temperature sensor. The test circuit 135 or the test controller 115 may convert such a temperature measurement value into device temperature data indicating a temperature (° C.).

The zone temperature acquiring unit 480 is configured to acquire zone temperature data according to the temperature measurement value of each of the plurality of zones 300. The zone temperature acquiring unit 480 may acquire zone temperature data according to a temperature measurement value corresponding to at least one zone 300 on which the device under test 400 is not mounted, among the plurality of zones 300. The zone temperature data may be the temperature measurement value itself, as in the case of the device temperature data, or may be data that is converted from the temperature measurement value and changes in accordance with the temperature measurement value.

In the present embodiment, the zone temperature acquiring unit 480 is configured to acquire the zone temperature data according to the temperature measurement value corresponding each zone 300 by causing each heater 310 corresponding to each zone 300 to function as a temperature sensor. Because the heater 310 is a resistor which generates heat in accordance with a flowing current, the resistance value of the resistor changes in accordance with the temperature. Thus, the zone temperature acquiring unit 480 stops heating by the heater 310 at the timing to measure the temperature of the zone 300, and cause a predetermined current for measurement to flow in the heater 310. Then, the zone temperature acquiring unit 480 measures a potential difference between both ends of the heater 310 where the current for measurement has flowed so that the zone temperature acquiring unit 480 can acquire a temperature measurement value which changes in accordance with the temperature of the zone 300.

Alternatively, the wafer chuck 100 may include a plurality of temperature sensors each provided for each zone 300 in the plurality of zones 300. In this case, the zone temperature acquiring unit 480 is configured to acquire zone temperature data according to the measurement value of the temperature sensor provided for corresponding zone 300 by using each of the plurality of temperature sensors.

The temperature control unit 490 is connected to the device temperature acquiring unit 470 and the zone temperature acquiring unit 480. The temperature control unit 490 is configured to control at least one heater 310 corresponding to at least one zone 300 on which at least part of the device under test 400 is mounted so as to close a gap between the temperature indicated by the device temperature data and a device target temperature. Herein, the device target temperature is also described as "the first target temperature".

Figure 5:
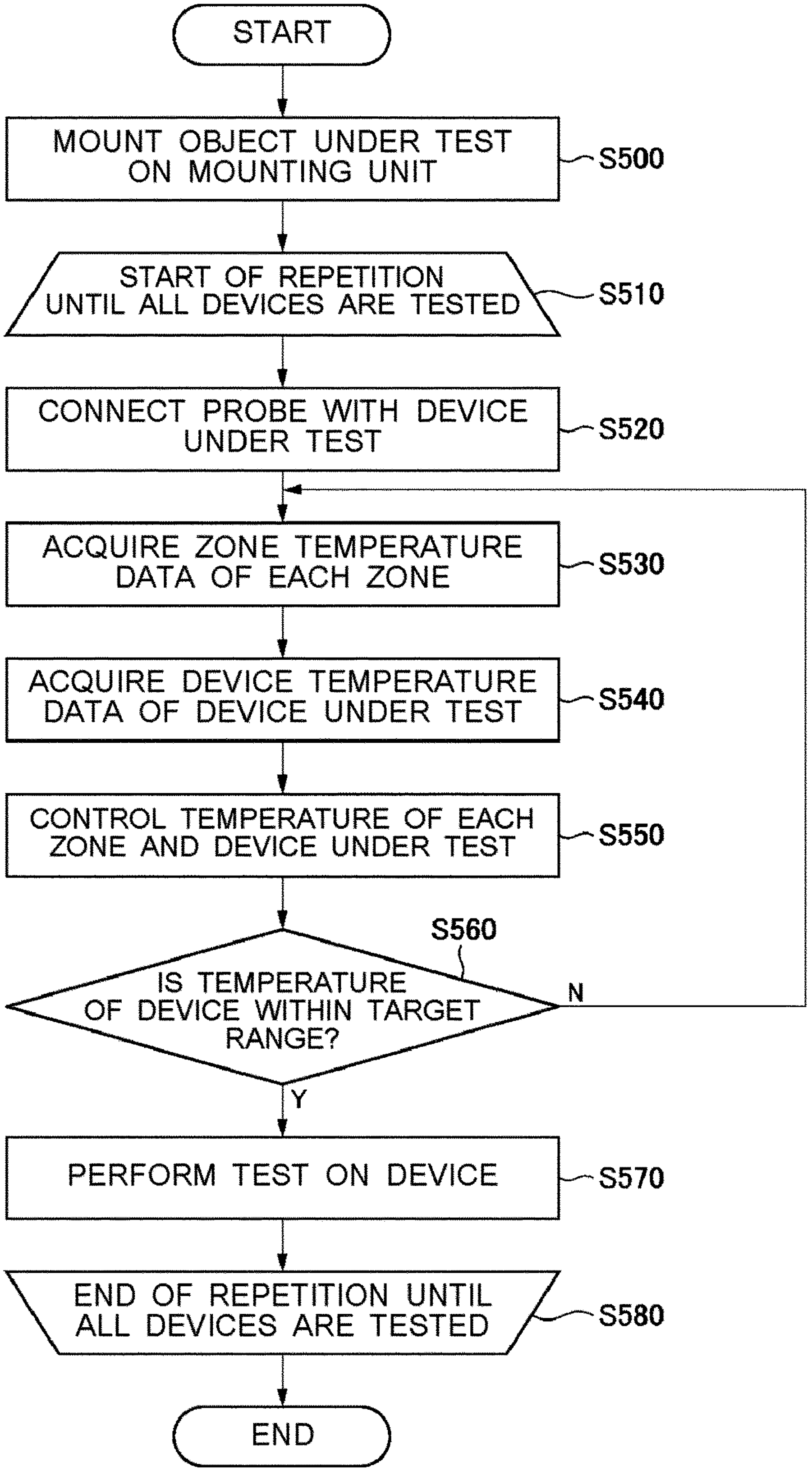
FIG. 5 shows the operation flow of the test apparatus 10 according to the present embodiment.

FIG. 5 shows the operation flow of the test apparatus 10 according to the present embodiment. In S500, the test apparatus 10 mounts the wafer 20 on the mounting unit 200 of the wafer chuck 100. The test controller 115 may inform an external handler apparatus that the next test of the wafer 20 became ready to start, and the handler apparatus informed of this may mount the wafer 20 on the mounting unit 200.

The test apparatus 10 repeats the test processing from S510 to S580 until tests of all devices formed on the wafer 20 end. When the wafer 20 includes N devices, if the test apparatus 10 can test only one device simultaneously, the test apparatus 10 repeats the test processing for one device N times. If the test apparatus 10 can perform tests on K (two, four or the like) devices simultaneously, the test apparatus 10 may repeat test processing for K devices N/K times.

In S520, the test apparatus 10 connects each probe 150 to at least one device under test 400 (when measuring K devices simultaneously, K devices under test 400) to be under test of the test processing this time. After the stage 105 in the test apparatus 10 moves, the wafer chuck 100 in XY directions such that each terminal of each device under test 400 is positioned directly below the corresponding probe 150 in response to the instruction from the test controller 115, the stage 105 in the test apparatus 10 moves the wafer chuck 100 in a Z direction toward the probe 150 (in the example of FIG. 1, cause the wafer chuck 100 to rise) so that the corresponding probe 150 contacts with each terminal of each device under test 400.

In S530, the zone temperature acquiring unit 480 in the temperature controller 120 acquires zone temperature data according to the temperature measurement value of each zone 300. In S540, the device temperature acquiring unit 470 in the temperature controller 120 acquires device temperature data of each device under test 400 via the probe 150, the HiFix 140, the test circuit 135, and the test controller 115. When the device under test 400 includes an electrode pad directly connected to the temperature sensor, the test circuit 135 can read the temperature measurement value of the temperature sensor via the probe 150 connected to the electrode pad. When the device under test 400 does not include an electrode pad directly connected to the temperature sensor, if the circuit inside the device under test 400 reads the temperature measurement value of the temperature sensor to store the temperature measurement value in a register, memory, or the like inside the device under test 400, the test circuit 135 may transmit a command or the like to read the temperature measurement value to a communication port of the device under test 400 connected to the test circuit 135 via the probe 150 and may read the temperature measurement value from the device under test 400. The test controller 115 may determine that a device under test 400 that does not properly respond to the command to read the temperature measurement value via the communication port is poor.

In S550, the temperature control unit 490 controls the temperature of each zone 300 and each device under test 400, based on the device temperature data of each device under test 400 and the zone temperature data of each zone 300. In the present embodiment, the temperature control unit 490 controls the amount of generated heat of each heater 310 by adjusting the magnitude of the current to flow in each heater 310. As the amount of generated heat of the heater 310 increases, the temperature of each zone 300 increases. In the present embodiment, the cooling unit 460 uniformly cools all zones 300. Accordingly, the temperature of each zone 300 falls when the amount of generated heat of the heater 310 is smaller than the amount of radiating heat through cooling down. The cooling apparatus 125 may set the temperature of the refrigerant to be supplied to the cooling unit 460 at a predetermined temperature. Alternatively, the temperature control unit 490 may set the temperature of the refrigerant supplied to the cooling unit 460 by the cooling apparatus 125 for the cooling apparatus 125.

The temperature control unit 490 controls at least one heater 310 corresponding to at least one zone 300 on which at least part of the device under test 400 is mounted so as to close the gap between the temperature indicated by the device temperature data and the device target temperature. Also, the temperature control unit 490 may control at least one other heater 310 corresponding to the at least one other zone 300 on which the device under test 400 is not mounted so as to close a gap between the temperature indicated by the zone temperature data and a zone target temperature. Herein, the zone target temperature is also described as "the second target temperature".

The device target temperature and the zone target temperature are predetermined in accordance with the specification of the test performed by the test apparatus 10. The temperature controller 120 may set the device target temperature and the zone target temperature in response to the instruction from the test controller 115. The zone target temperature may be the same as the device target temperature, or may be a value obtained by adding a positive or negative offset defined by a user to the device target temperature. For example, the test apparatus 10 may set the zone target temperature at a value same as or close to the device target temperature so that the device other than the device under test 400 is preheated and can be tested immediately after becoming a test target.

In S560, the test controller 115 determines whether the temperature indicated by the device target data of each device under test 400 is within a target range which is within a device target temperature±a tolerance. When the temperature indicated by the device target data is not within the target range, the test controller 115 allows the process to proceed to S530 and continues adjusting the temperature of the device under test 400 by the temperature controller 120. When the temperature indicated by the device target data is within the target range, the test controller 115 allows the process to proceed to S570. Note that the test controller 115 may include or may not include the temperature of each zone 300 in determining conditions in S560. The test controller 115 may allow the process to proceed to S570 on the additional condition that the temperature indicated by the zone target data of each zone 300 is within a target range which is within a zone target temperature±a tolerance.

In S570, the test apparatus 10 performs a test on each device under test 400. The test apparatus 10 determines the quality of the device under test 400 in accordance with the test result. The test apparatus 10 completes the test of the wafer 20 when the test processing from S510 to S580 for all of the devices ends.

The temperature controller 120 described above can perform temperature control on the device under test 400 connected to the probe 150, which enables the device temperature data to be acquired, among all of the devices of the wafer 20 by acquiring the device temperature data of the device under test 400 so as to cause the temperature indicated by the device temperature data of the device under test 400 to be the device target temperature. Thus, the temperature controller 120 can set the temperature of the device under test 400 at the device target temperature with greater precision compared to the case where the temperature control is performed using the temperature measurement value on the wafer chuck 100 side.

In addition, by using the temperature controller 120, temperature control can be performed on a zone 300 on which a device not contacting with the probe is mounted, the device temperature data of which is unidentified, so as to cause the temperature measurement value to be the zone target temperature by using the zone temperature data according to the temperature measurement value of each zone 300.

Figure 6:
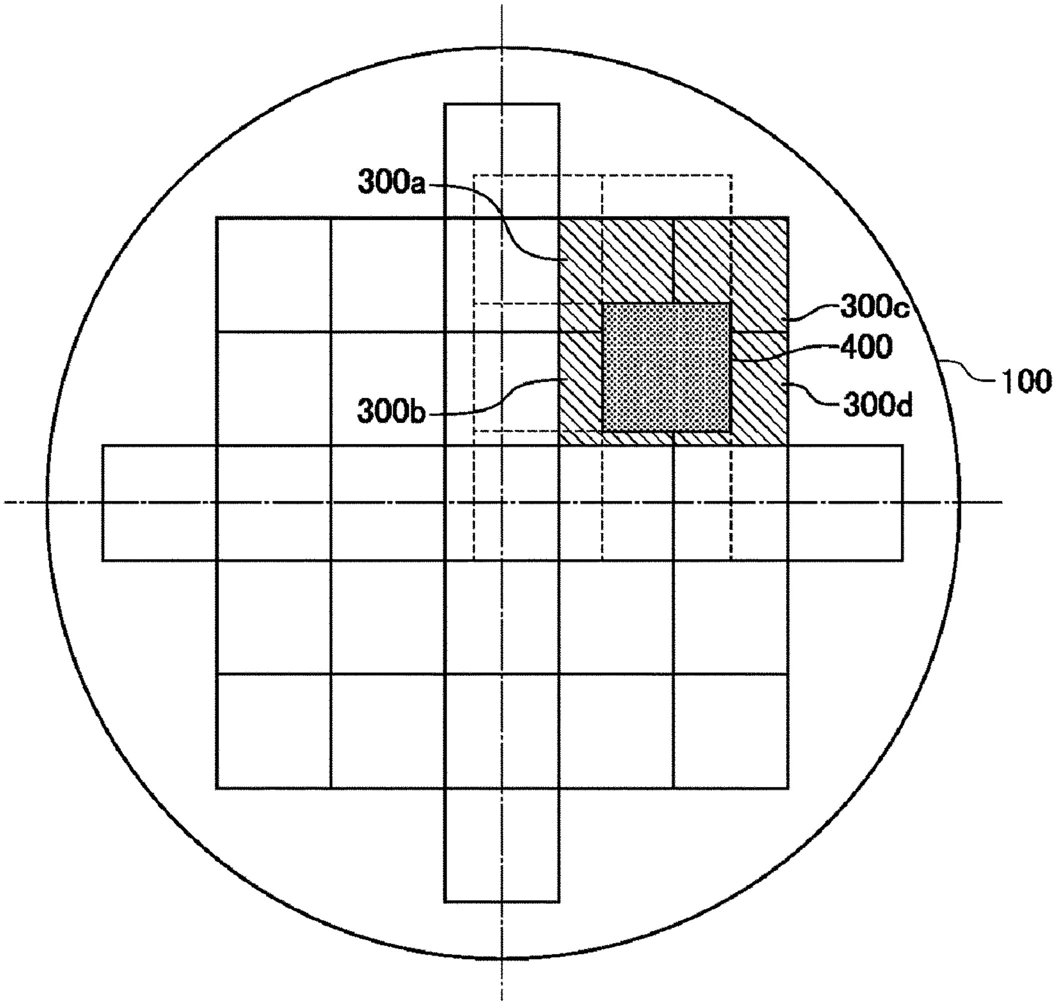
FIG. 6 shows an arrangement example of the device under test 400 on the mounting unit 200 according to the present embodiment.

FIG. 6 shows an arrangement example of the device under test 400 on the mounting unit 200 according to the present embodiment. As shown in the present drawing, each device may not be arrayed to match with each zone 300, and may be arranged over two or more zones 300. In addition, the size of each of the plurality of zones 300 may be identical with the size of each of the plurality of devices, or may be different from the size of each of the plurality of devices. In this case, it is possible that at least part of the device under test 400 is mounted on each of two or more zones 300. In the example of the present drawing, part of the device under test 400 is mounted on each of four zones 300, zones 300*a-d*.

In such a case, the temperature control unit 490 may control two or more heaters 310 corresponding two or more zones 300 on each of which at least part of the device under test 400 is mounted so as to close the gap between the temperature indicated by the device temperature data and the device target temperature. The temperature control unit 490 calculates positional relationship of each device and each zone 300 by using information of the position and size of each device and information of the position and size of each zone 300 in the wafer 20. The temperature control unit 490, for example, may set the temperatures of each zone 300 on which at least part of the device under test 400 is mounted at the same temperature, and when the temperature indicated by the device temperature data is lower than the device target temperature, the temperature control unit 490 may increase the temperature of these zones 300, and when the temperature indicated by the device temperature data is higher than the device target temperature, the temperature control unit 490 may decrease the temperature of these zones 300.

The temperature control unit 490 may set the temperatures of each zone 300 on which at least part of the device under test 400 is mounted at different temperatures and adjust the temperature of the device under test 400. For example, the temperature control unit 490 may adjust the temperature of the device under test 400 by more greatly changing the temperature of the zone 300 that has a larger influence on the temperature of the device under test 400, for example, because the area of the device under test 400 overlapping with the zone 300 is larger, or because the distance between the center of the zone 300 and the center of the device under test 400 is smaller. In this case, the temperature control unit 490 may perform temperature control with a bias added so as to close the gap between the temperature of each zone 300 and the temperature adjacent zone 300.

In addition, the temperature control unit 490 may control each heater 310 corresponding to each zone 300 on which the device under test 400 is not mounted so as to close the gap between the temperature indicated by the zone temperature data of each zone 300 and the zone target temperature. In this case, the temperature control unit 490 may also perform temperature control with a bias added so as to cause the temperature of each zone 300 to be closer to the temperature of the adjacent zone 300. In this case, the temperature control unit 490 controls the target zone 300 adjacent to the zone 300 on which the device under test 400 is mounted to cause the temperature of this zone to be a temperature between the temperature of the adjacent zone 300 on which the device under test 400 is mounted and the temperature of the adjacent zone 300 on which the device under test 400 is not mounted.

As an example, the temperature control unit 490 may control the temperature of each zone 300 on which at least part of the device under test 400 is mounted by using the following parameter ΔT1.

$$\Delta T1 = a \times S \times (TGdev - Tdev) + b \times (Tnbr - Tzone) \quad (1)$$

Here, a and b are predetermined positive factors, S is a factor according to the area of the device under test 400 overlapping with the zone 300 (or a factor which becomes larger as the distance between the center of the zone 300 and the center the device under test 400 decrease), Tdev is a temperature indicated by the device temperature data, TGdev is a device target temperature, Tzone is a temperature indicated by the zone temperature data, and Tnbr is an average value of temperatures of the adjacent zones 300.

The first term of ΔT1 takes a value according to a product of a difference between a device target temperature and a temperature of a device under test 400 and an overlap of the target zone 300 and the device under test 400, and become a larger positive value as the temperature of the device under test 400 is smaller compared to the device target temperature and the target zone 300 and the device under test 400 overlapped more largely. Accordingly, the temperature control unit 490 controls the temperature of the zone 300 to change the temperature of the zone 300 more largely as the target zone 300 overlaps with the device under test 400 more largely.

The second term of ΔT1 takes a positive value which becomes larger as a difference obtained by subtracting the temperature of the target zone 300 from the average value of the temperatures of two or more zones 300 adjacent to the target zone 300 increases. Accordingly, the temperature control unit 490 adds a bias so as to cause the temperature of the target zone 300 to be closer to the average value of the temperatures of the adjacent zones 300. To further increase the weight of the first term of ΔT1, b may be set smaller when compared to a×S. In addition, the temperature control unit 490 may perform temperature control of the zone 300 while setting b=0 and not using the second term.

When ΔT1 is positive, the temperature control unit 490 increases the amount of generated heat of the heater 310 associated with the target zone 300 so as to increase the temperature of the target zone 300. When ΔT1 is negative, the temperature control unit 490 decreases the amount of generated heat of the heater 310 associated with the target zone 300 so as to decrease the temperature of the target zone 300. Here, the temperature control unit 490 may control the amount of generated heat of the heater 310 by control such as PID control using an input of ΔT1, or control using an output value of predetermined filtering processing using an input of ΔT1.

The temperature control unit 490 may control the temperature of each zone 300 on which the device under test 400 is not mounted using the following parameter ΔT2.

$$\Delta T2 = c \times (TGzone - Tzone) + d \times (Tnbr - Tzone) \quad (2)$$

Here, c and d are predetermined positive factors.

The first term of ΔT2 takes a value according to a difference between the zone target temperature and a temperature of a target zone 300, and become a larger positive value as the temperature of the target zone 300 is smaller than the zone target temperature. Accordingly, the temperature control unit 490 changes the temperature of the target zone 300 more largely as the temperature of the target zone 300 is smaller compared to the zone target temperature.

The second term of ΔT2 takes a positive value which becomes larger as a difference between the average value of temperatures of the zones 300 adjacent the target zone 300 and the temperature of the target zone 300 increases. Accordingly, the temperature control unit 490 adds a bias so as to cause the temperature of the target zone 300 to be closer to the average value of the temperatures of the adjacent zones 300. To further increase the weight of the first term of ΔT2, d may be set smaller when compared to c. In addition, the temperature control unit 490 may perform temperature control of the zone 300 while setting d=0 and not using the second term.

When ΔT2 is positive, the temperature control unit 490 increases the amount of generated heat of the heater 310 associated with the target zone 300 so as to increase the temperature of the target zone 300. When ΔT2 is negative, the temperature control unit 490 decreases the amount of generated heat of the heater 310 associated with the target zone 300 so as to decrease the temperature of the target zone 300. Here, the temperature control unit 490 may control the amount of generated heat of the heater 310 by control such as PID control using an input of ΔT2, or control using an output value of predetermined filtering processing using an input of ΔT2.

By performing the temperature control described in association with the present drawing, the temperature control apparatus 430 can largely adjust the temperature of the zone 300 which has a larger area overlapping with the device under test 400 or which is closer to the device under test 400 so as to close the gap between the temperature of the device under test 400 and the device target temperature. In addition, in a case where the temperature control apparatus 430 adjusts the temperature of each zone 300 in accordance with the temperature of the adjacent zone 300, the temperature control apparatus 430 can increase the amount of generated heat of the heaters 310 of zones 300 surrounding a particular zone 300, instead of extremely increasing the amount of generated heat of the particular heater 310 to cause the temperature of the particular zone to be locally high, so that load applied to the heater 310 of the particular zone 300 can further be uniform.

Various embodiments of the present invention may be described with reference to flowcharts and block diagrams whose blocks may represent (1) steps of processes in which operations are executed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. The dedicated circuitry may include a digital and/or analog hardware circuit, or may include an integrated circuit (IC) and/or a discrete circuit. The programmable circuitry may include a reconfigurable hardware circuit including logical AND, logical OR, logical XOR, logical NAND, logical NOR and other logical operations, and a memory element such as a flip-flop, a register, a field programmable gate array (FPGA) and a programmable logic array (PLA), and the like.

A computer-readable medium may include any tangible device that can store instructions to be executed by a suitable device, and as a result, the computer-readable medium having instructions stored in the tangible device comprises an article of manufacture including instructions which can be executed to create means for executing operations specified in the flowcharts or block diagrams. Examples of the computer readable media may include an electronic storage medium, a magnetic storage medium, an optical storage medium, an electromagnetic storage medium, a semiconductor storage medium, and the like. More specific examples of the computer-readable medium may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a portable compact disc read-only memory (CD-ROM), a digital versatile disc (DVD), a Blu-ray® disc, a memory stick, an integrated circuit card, or the like.

The computer-readable instructions may include assembler instructions, instruction-set-architecture (ISA) instructions, machine instructions, machine dependent instructions, microcode, firmware instructions, state-setting data, or either source code or object code described in any combination of one or more programming languages, including an object oriented programming language such as Smalltalk (registered trademark), JAVA (registered trademark) and C++, and a conventional procedural programming language such as a 'C' programming language or similar programming languages.

Computer-readable instructions may be provided to a processor of a programmable data processing apparatus such as a general-purpose computer, special purpose computer, or another computer, or to programmable circuitry, locally or via a local area network (LAN), wide area network (WAN) such as the Internet, etc., so that the computer-readable instructions are executed to create means for executing operations specified in the flowcharts or block diagrams. Examples of the processor include a computer processor, a processing unit, a microprocessor, a digital signal processor, a controller, a microcontroller, and the like.

Figure 7:
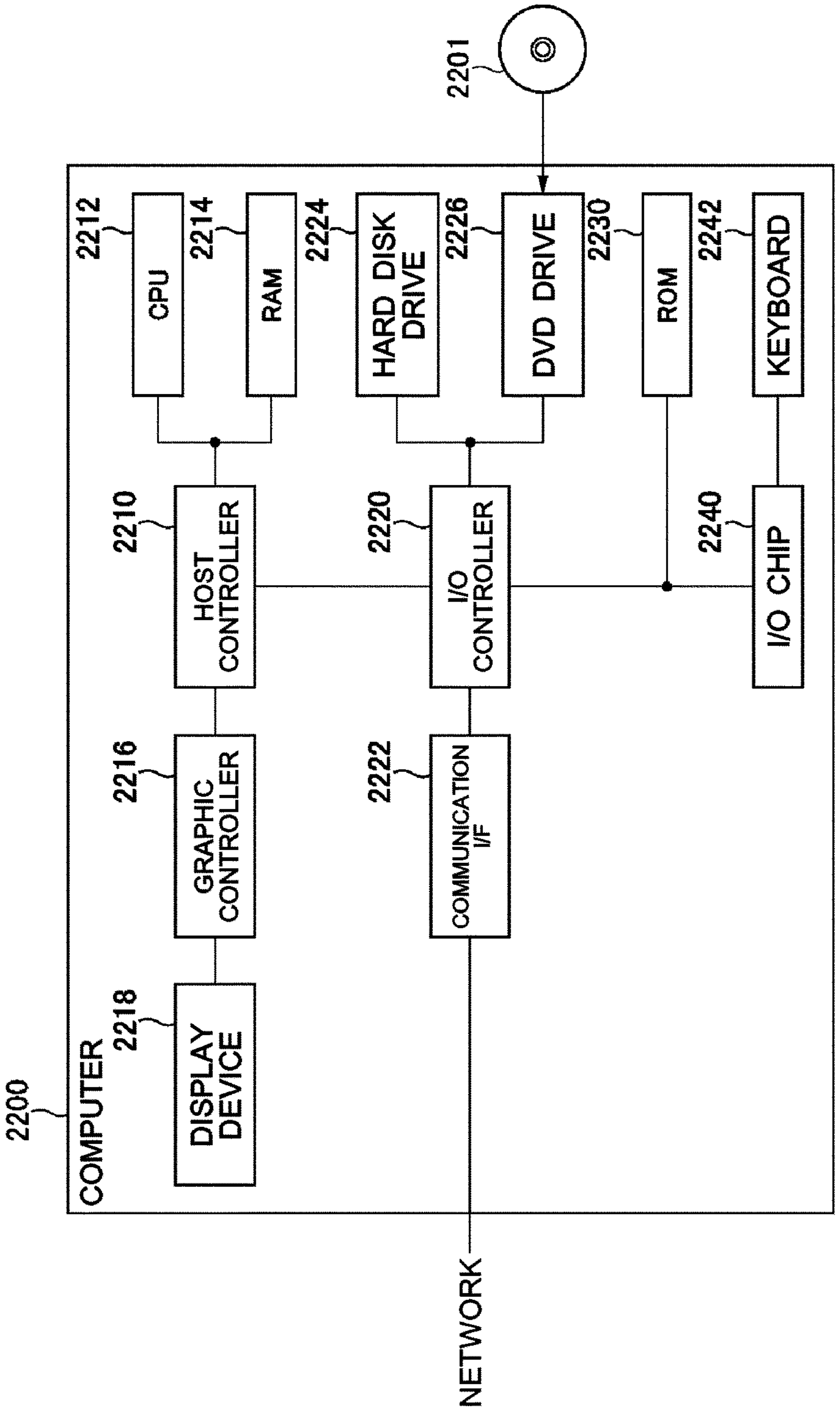
FIG. 7 shows an example of a computer 2200 in which aspects of the present invention may be wholly or partly embodied.

FIG. 7 shows an example of a computer 2200 in which aspects of the present invention may be wholly or partly embodied. A program that is installed in the computer 2200 can cause the computer 2200 to function as or perform manipulations associated with apparatuses of the embodiments of the present invention or one or more sections thereof, and/or cause the computer 2200 to perform processes of the embodiments of the present invention or steps thereof. Such a program may be executed by the CPU 2212 to cause the computer 2200 to perform certain manipulations associated with some or all of the blocks of flowcharts and block diagrams described herein.

The computer 2200 according to this embodiment includes a CPU 2212, a RAM 2214, a graphics controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 through an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads the programs and the data from an IC card, and/or writes the programs and the data to the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, or the like to the input/output controller 2220.

A program is provided by computer-readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the above-mentioned various types of hardware resources. An apparatus or method may be constituted by realizing the manipulation or processing of information in accordance with the usage of the computer 2200. For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc. and perform various types of processing on data on the RAM 2214. The CPU 2212 may then write back the processed data to the external recording medium.

Various types of information, such as various types of programs, data, tables, and databases, may be stored in the recording medium and may be subjected to information processing. The CPU 2212 may perform various types of processing on the data read from the RAM 2214, which includes various types of manipulations, information processing, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The program or software modules described above may be stored in the computer readable media on or near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 test apparatus
20 wafer
100 wafer chuck
105 stage
110 mainframe
115 test controller
120 temperature controller
125 cooling apparatus
130 test head
135 test circuit
140 HiFix
145 probe card
150 probe
200 mounting unit
210 mounting surface
220*a-b* inlet
230*a-b* outlet
240 heater terminal
250 flow channel
300 zone
310 heater
320 ground plane
400 device under test
410 probe apparatus
420 test unit
430 temperature control apparatus
460 cooling unit
470 device temperature acquiring unit
480 zone temperature acquiring unit
490 temperature control unit
2200 computer
2201 DVD-ROM
2210 host controller
2212 CPU
2214 RAM
2216 graphics controller
2218 display device
2220 input/output controller
2222 communication interface
2224 hard disk drive
2226 DVD-ROM drive
2230 ROM
2240 input/output chip
2242 keyboard

What is claimed is:

1. A temperature control apparatus, comprising:

a mounting unit including a mounting surface on which a test object in a board shape is mounted, wherein a plurality of devices are formed on the test object;

a plurality of heaters, each of which is provided for each of a plurality of zones into which the mounting surface is divided, configured to heat a corresponding one of the plurality of zones;

a device temperature acquiring unit configured to acquire device temperature data according to a temperature measurement value in a device under test connected to a probe for an operation test, the device under test being one of the plurality of devices formed on the test object; and a temperature control unit configured to control two or more heaters corresponding to two or more zones on each of which at least part of the device under test is mounted so as to close a gap between the temperature indicated by the device temperature data and a first target temperature;

wherein a size of each of the plurality of zones is different from a size of each of the plurality of devices such that the device under test overlaps two or more of the plurality of zones.

2. The temperature control apparatus according to claim 1, wherein the temperature control unit is able to set a temperature of each zone on which at least part of the device under test is mounted at different temperatures and adjust a temperature of the device under test.

3. The temperature control apparatus according to claim 2, wherein the temperature control unit controls each of the two or more heaters corresponding to each of the two or more zones depending on an area of the device under test overlapped with each of the two or more zones or a distance between a center of a zone and a center of the device under test.

4. The temperature control apparatus according to claim 3, further comprising a zone temperature acquiring unit configured to acquire zone temperature data according to a temperature measurement value corresponding to at least one other zone on which the device under test is not mounted among the plurality of zones, wherein the temperature control unit is configured to control at least one other heater corresponding to the at least one other zone so as to close a gap between a temperature indicated by the zone temperature data and a second target temperature.

5. The temperature control apparatus according to claim 3, wherein the plurality of zones are arranged in a grid shape on the mounting surface.

6. A test apparatus, comprising:

a probe apparatus configured to connect at least one probe to at least one terminal of a device under test to be a target of an operation test in a board shape on which a plurality of devices are formed;

the temperature control apparatus according to claim 3; and a test unit configured to perform an operation test of the device under test by using the at least one probe.

7. The temperature control apparatus according to claim 2, further comprising a zone temperature acquiring unit configured to acquire zone temperature data according to a temperature measurement value corresponding to at least one other zone on which the device under test is not mounted among the plurality of zones, wherein the temperature control unit is configured to control at least one other heater corresponding to the at least one other zone so as to close a gap between a temperature indicated by the zone temperature data and a second target temperature.

8. The temperature control apparatus according to claim 2, wherein the plurality of zones are arranged in a grid shape on the mounting surface.

9. A test apparatus, comprising:

a probe apparatus configured to connect at least one probe to at least one terminal of a device under test to be a target of an operation test in a board shape on which a plurality of devices are formed;

the temperature control apparatus according to claim 2; and a test unit configured to perform an operation test of the device under test by using the at least one probe.

10. The temperature control apparatus according to claim 1, further comprising a zone temperature acquiring unit configured to acquire zone temperature data according to a temperature measurement value corresponding to at least one other zone on which the device under test is not mounted among the plurality of zones, wherein the temperature control unit is configured to control at least one other heater corresponding to the at least one other zone so as to close a gap between a temperature indicated by the zone temperature data and a second target temperature.

11. The temperature control apparatus according to claim 10, further comprising a plurality of temperature sensors each provided for each zone of the plurality of zones, wherein the zone temperature acquiring unit is configured to acquire zone temperature data according to a measurement value of at least one temperature sensor provided for the at least one other zone among the plurality of temperature sensors.

12. The temperature control apparatus according to claim 10, wherein the zone temperature acquiring unit is configured to acquire zone temperature data according to a temperature measurement value corresponding to the at least one other zone by causing the at least one other heater corresponding to the at least one other zone to function as a temperature sensor.

13. The temperature control apparatus according to claim 10, wherein the plurality of zones are arranged in a grid shape on the mounting surface.

14. The temperature control apparatus according to claim 1, wherein the plurality of zones are arranged in a grid shape on the mounting surface.

15. A test apparatus, comprising:

a probe apparatus configured to connect at least one probe to at least one terminal of a device under test to be a target of an operation test in a board shape on which a plurality of devices are formed;

the temperature control apparatus according to claim 1; and a test unit configured to perform an operation test of the device under test by using the at least one probe.

16. A temperature control method, comprising:

mounting a test object in a board shape on a mounting surface of a mounting unit, wherein a plurality of devices are formed on the test object;

acquiring device temperature data according to a temperature measurement value in a device under test connected to a probe for an operation test, the device under test being one of the plurality of devices formed on the test object; and controlling, among a plurality of heaters each of which is provided for each of a plurality of zones into which the mounting surface is divided and configured to heat corresponding one of the plurality of zones, two or more of the plurality of heaters corresponding to two or more of the plurality of zones on each of which at least part of the device under test is mounted so as to close a gap between a temperature indicated by the device temperature data and a first target temperature;

wherein a size of each of the plurality of zones is different from a size of each of the plurality of devices such that the device under test overlaps two or more of the plurality of zones.

17. A non-transitory computer readable medium that stores a temperature control program executed by a computer, which causes the computer to function as:

a device temperature acquiring unit configured to acquire device temperature data according to a temperature measurement value in a device under test connected to a probe for an operation test, the device under test being one of the plurality of devices formed on a test object in a board shape mounted on a mounting surface of a mounting unit; and a temperature control unit configured to control, among a plurality of heaters each of which is provided for each of a plurality of zones into which the mounting surface is divided and configured to heat a corresponding one of the plurality of zones, two or more of the plurality of heaters corresponding to two or more of the plurality of zones on each of which at least part of the device under test is mounted, to close a gap between a temperature indicated by the device temperature data and a first target temperature;

wherein a size of each of the plurality of zones is different from a size of each of the plurality of devices such that the device under test overlaps two or more of the plurality of zones.

* * * * *